United States Patent [19]

Schuurmans et al.

[11] Patent Number: 5,120,568
[45] Date of Patent: * Jun. 9, 1992

[54] METHOD FOR PLASMA SURFACE TREATING AND PREPARATION OF MEMBRANE LAYERS

[75] Inventors: Hubertus J. A. Schuurmans; Jan Werner, both of Amsterdam; Daniel C. Schram; Gerardus M. W. Kroesen, both of Eindhoven, all of Netherlands

[73] Assignee: Shell Oil Company, Houston, Tex.

[*] Notice: The portion of the term of this patent subsequent to Sep. 18, 2007 has been disclaimed.

[21] Appl. No.: 527,914

[22] Filed: May 24, 1990

Related U.S. Application Data

[62] Division of Ser. No. 191,502, May 9, 1988, Pat. No. 4,957,062.

[30] Foreign Application Priority Data

Jun. 16, 1987 [GB] United Kingdom ............... 8713986

[51] Int. Cl.$^5$ ............................................. B05D 3/06
[52] U.S. Cl. ......................................... 427/37; 427/38
[58] Field of Search .................. 427/37, 38; 118/50.1, 118/723

[56] References Cited

U.S. PATENT DOCUMENTS 4,596,718  6/1986  Gruner ................................. 427/34
4,957,062  9/1990  Schuurmans et al. ............... 118/723

FOREIGN PATENT DOCUMENTS 0103461  3/1984  European Pat. Off. .
62-120477  6/1987  Japan ................................. 118/723

OTHER PUBLICATIONS

7th International Symposium on Plasma Chemistry, Jul. 1-5, 1985, vol. 2, "A New Approach of Plasma Deposition," G. M. W. Kroesen, pp. 698-703.
Boenig, H. V., "Plasma Science and Technology," Ithaca, N.Y., Cornell University Press, 1982, p. 18.

*Primary Examiner*—Evan Lawrence

[57] ABSTRACT

A process for preparing membrane layers employing an apparatus suitable for plasma surface treating (e.g. forming a membrane layer on a substrate) which comprises a plasma generation section which is operable at least at substantially atmospheric pressure and is in communication via at least one plasma inlet (e.g. a nozzle) with an enclosed plasma treating section which is operable at a lower pressure than the plasma generation section, and wherein the plasma treating-section is in communication with an inlet for a fluid (e.g. polymerizable) reactant. A plasma beam generated in the apparatus and containing at least one fluid reactant impinges on the surface of a substrate to form a membrane layer.

1 Claim, 1 Drawing Sheet ns s# METHOD FOR PLASMA SURFACE TREATING AND PREPARATION OF MEMBRANE LAYERS This is a division of application Ser. No. 191,502 filed May 9, 1988, now U.S. Pat. No. 4,957,062.

BACKGROUND OF THE INVENTION

The invention relates to an apparatus suitable for plasma surface treating and furthermore to a process for preparing membrane layers.

DESCRIPTION OF THE PRIOR ART

Various apparatuses for plasma surface treating are known in which a plasma of an inert gas is generated in an enclosed space in which a pressure substantially below 0.1 bar is maintained e.g. by means of a vacuum pump and the plasma is brought into contact with a surface to be treated i.e. plasma generation and plasma treating is carried out in the same space, optionally in the presence of a fluid reactant which may be polymerized and/or deposited onto said surface in order to form a coating layer.

A major disadvantage of the above-mentioned known apparatuses is that the deposition rate of the fluid reactant(s) is generally very low, i.e. in the order of 1-2 nm/s. This is due to the limited efficiency of the production of reactive plasma particles, i.e. electrons, ions, radicals, molecular fragments and atoms in the ground state or in an excited state, in case ion beam plasma generation means are applied and limited efficiency of the transportation of reactive plasma particles from the plasma generation means towards the surface which is to be treated.

SUMMARY OF THE INVENTION

Surprisingly, it has now been found that the above-discussed disadvantages can be overcome and that a wide variety of surfaces can be substantially uniformly treated with a plasma in combination with a fluid reactant resulting in relatively high deposition rates on said surfaces in an apparatus comprising separate sections for plasma generation and for plasma treating which can be operated separately at optimal conditions, in which apparatus the plasma treating-section is in communication with inlet means for a fluid reactant.

The invention therefore relates to an apparatus suitable for plasma surface treating which comprises a plasma generation section which is operable at least at substantially atmospheric pressure and is in communication via at least one plasma inlet means with an enclosed plasma treating section which is operable at a lower pressure than the plasma generation section, characterized in that the plasma treating-section is in communication with inlet means for a fluid reactant.

The invention furthermore relates to a process for preparing membrane layers which comprises generating a plasma in a plasma generation zone which is maintained at a pressure of at least 0.1 bar, expanding the plasma into a plasma treating zone which is maintained at a pressure of less than 0.1 bar, introducing at least one fluid reactant in the plasma treating zone and allowing the reactant(s) to form a membrane layer on a substrate.

Only the plasma treating section of the apparatus according to the invention is in communication with the fluid reactant inlet means, because in this case dissociation of the fluid reactant molecules (preferably comprising hydrocarbonaceous monomers), i.e. the amount of inter-atomic bonds that break, can be influenced by varying the ratio of the number and the energy of the plasma-forming atoms and the number of reactant molecules introduced through the fluid reactant inlet means. In the afore-described manner it is possible to gradually change the particle flux and the average energy per particle which reaches the surface to be treated.

A further advantage of the present apparatus is that direct injection of the fluid reactant into the feed gas which is to be converted into a plasma in the plasma generation section is avoided which is important in case metal (e.g. tungsten) cathodes are employed for high temperature (e.g. more than 2000° C., or even more than 8000° C.) plasma generation because said cathodes react with carbon atoms originating from the hydrocarbon monomers to form metal carbides which will evaporate and cause contamination of the plasma.

In a preferred embodiment of the present apparatus the fluid reactant inlet means has at least one opening located between the plasma inlet means and a target area on a support means for plasma surface treating in the plasma treating section; in particular, it is preferred that the above-mentioned fluid reactant inlet means comprises annular-shaped distribution means provided with a plurality of openings and is arranged in the plasma treating section in alignment with the plasma inlet means so that a plasma bundle can pass through the annular opening of the distribution means.

Plasma may be, in principle, generated in a variety of different ways in the plasma generation section of the apparatus according to the invention e.g. by means of an RF field (e.g. at 1-10 MHz) which is either capacitively or inductively coupled, a microwave field (e.g. at 0.5-10 GHz) or a direct current (DC) arc.

However, in order to attain relatively high deposition rates of reactant on a surface to be treated, it is preferred to apply a thermal plasma in the plasma generation section with a high gas temperature (of about 8000-12000 K.) and a relatively large power density. This is preferably attained by using a cascaded arc as the energy source. Compared to conventional sources (e.g. Xenon short arcs) a cascaded arc offers a relatively large radiating volume which yields a plasma bundle with a relatively large intensity when plasma inlet means (for the plasma treating section) with a small diameter are used.

The invention is illustrated by the Figures which are discussed hereinafter.

IN THE DRAWINGS

FIG. 1 relates to a longitudinal section of a schematically depicted apparatus according to the invention.

In FIG. 2 a longitudinal section of a cascaded arc plasma generation means is depicted.

DETAILED DESCRIPTION OF THE INVENTION

Figure 1:
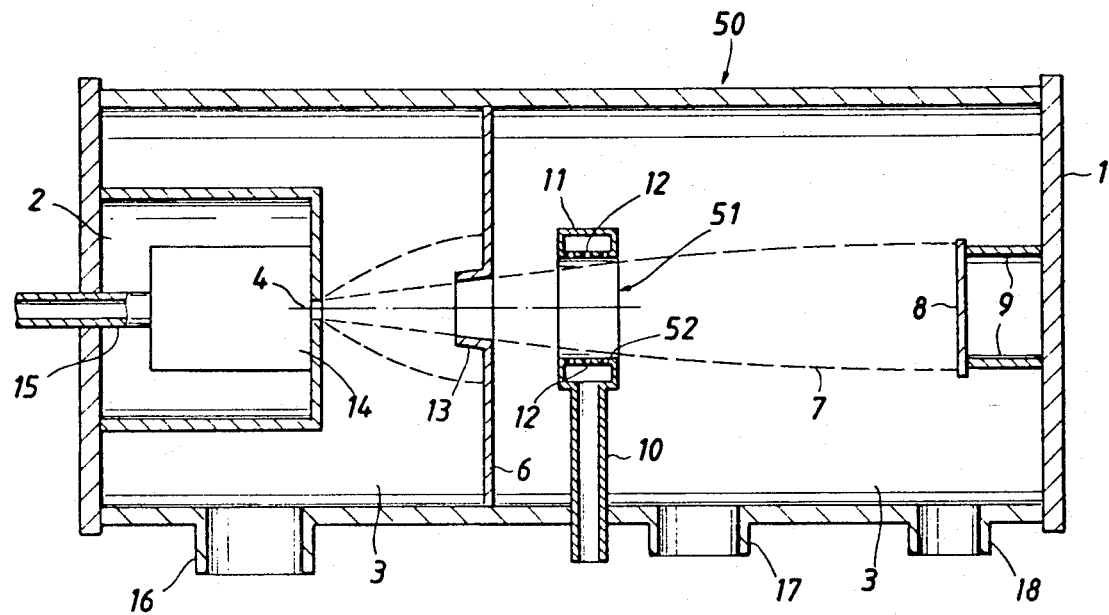

In FIG. 1 a preferred embodiment of the plasma surface treating apparatus 50 according to the invention is shown comprising a housing (1) which contains plasma generation section (2) and plasma treating section (3). Plasma inlet means (4) preferably comprises a nozzle debouching into the plasma treating section (3) which suitably contains directing means (6) provided with rim-shaped skimming means (13) for directing a plasma beam (7) towards a surface (8) of a layer of material which is to be treated with said plasma beam. The aforesaid layer is held in place by support means (9)

in an apparatus for discontinuous plasma treating as shown. However, it is also possible to adapt the apparatus according to the invention to allow continuous operation e.g. by providing transportation means (not depicted in FIG. 1) for a roll of material inside or outside plasma treating section (3).

The fluid reactant inlet means (10) are arranged in the plasma treating section (3). Inlet means (10) comprises annular-shaped distribution means (11) having a central opening 51, and provided with a plurality of openings (12) which are preferably distributed evenly over the inner wall 52 of distribution means (11) in order to ensure optimal contact of the fluid reactant with plasma beam (7).

Housing (1) further contains plasma generating means (14) (schematically depicted as a box in FIG. 1) which are preferably in communication with inlet means (15) for a plasma-forming fluid in order to ensure (semi-) continuous operation of the present apparatus. The plasma-forming fluid may comprise any fluid known in the art of generating plasmas, e.g. inorganic gases such as nitrogen, oxygen, ammonia and/or carbon dioxide. Preferably, said fluid contains at least one element from Group 0 of the Periodic Table of the Elements, in particular argon; mixtures of argon with hydrogen and/or helium can be also suitably used as plasma-forming fluid.

Reference is made to the Periodic Table of the Elements as given in the Handbook of chemistry and physics, 55th edition (1975), CRC Press, Ohio, USA.

The ratio of the fluid flow rates of the plasma-forming fluid and the reactants (expressed in $m^3/s$) is suitably from 1–1000, and preferably from 8–400. It appears that with an increasing ratio the quantity of carbon- and hydrogen radicals present in the plasma relative to the quantity of CH radicals decreases when toluene is present in the fluid reactant employed in the apparatus and process according to the invention.

The fluid reactants suitably contain a monomeric organic compound of an ionizable nature such as aromatics, organosilanes, olefins, alkylene oxides, (halogenated) lower hydrocarbons and (acrylo) nitriles. Said reactants preferably contain at least one aromatic monomer, in particular toluene, and/or at least one organosilane compound when the apparatus according to the invention is to be used for preparing membrane layers.

In order to be able to provide controlled plasma surface treating without depositing undesired components on the surface to be treated, the process according to the invention is preferably carried out by maintaining the plasma generation zone (section (2) in FIG. 1) at a pressure of at least 0.5 bar, and in particular at least at substantially atmospheric pressure e.g. at a pressure from 0.5–5 bar. It should be noted that the pressure indicated as P arc (which is the pressure of the plasma generated in an electric arc in the plasma generation section) is in most cases higher than the pressure in the space inside the plasma generation section around the electric arc. The plasma treating zone (section (3) of the apparatus depicted in FIG. 1) is preferably maintained at a pressure of at most 0.05 bar (=5 kPa), in particular less than 200 Pa, in order to attain high rates of deposition of desired reactants on the surface which is to be treated.

The aforementioned sub-atmospheric pressures can be attained by means of any vacuum pumping means. In a preferred embodiment of the apparatus as depicted in FIG. 1, outlet means (16) is connected to a rotary piston pump (not shown), outlet means (17) is connected with a Roots blower and outlet means (18) with an oil diffusion pump.

Figure 2:
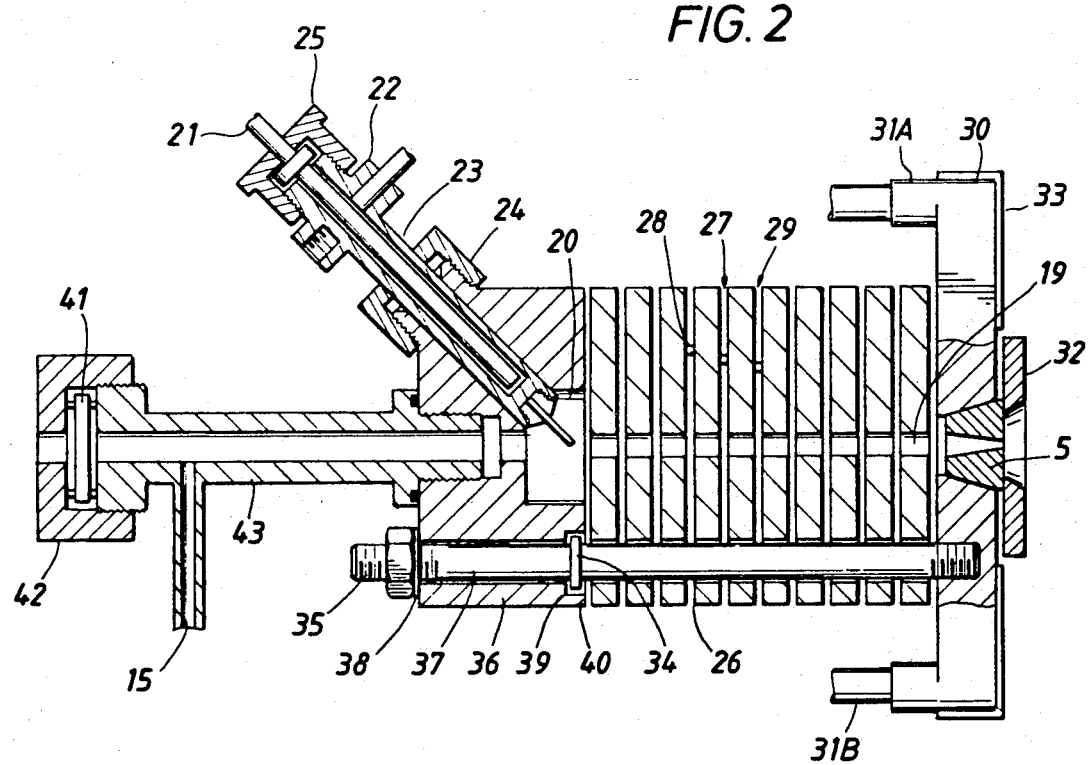

As discussed hereinbefore, a high temperature plasma is preferably generated by means of a cascaded arc. Plasma generation means which are particularly suited for the present purpose are depicted in FIG. 2 and comprise a central channel (19) e.g. having a length from 40–80 mm and a diameter from 2–6 mm through which a current from 20–200 A flows during opertion. The current flows from nozzle-shaped anode (5) (which serves as plasma inlet means (4) for the apparatus according to FIG. 1) to three cathode tips (20) of which one is shown in FIG. 2 and which are preferably rotation-symmetrically arranged with respect to central channel (19).

The cathodes have a hollow core (21) and are water-cooled in order to avoid melting of the cathodes. Cathode tips (20) are preferably made of a tungsten- and thorium-containing alloy which shows a higher electron emission rate than pure tungsten and which allows the temperature of the tips to be maintained below the melting point of tungsten, thus avoiding contamination of the plasma treated surface with tungsten atoms. Each cathode comprises a cathode housing (22) which is at least partly contained in isolating mantle (23) e.g. made of quartz, which is kept in place by means of cathode mounting screw (24). Core mounting screw (25) is removably attached to housing (22).

The arc voltage is preferably from 20–200 V, in particular from 50–150 V. The arc is suitably started up by lowering the pressure inside a plasma generation section containing the cascaded arc plasma generation means while the power supply is already switched on in order to reach the Paschen minimum where the arc will ignite. After ignition the pressure is quickly increased which allows the arc plasma to be formed after the intermediate plasma stages have been passed.

The conventional way of starting an arc is preferably not used in this case because of contamination reasons. In that procedure a short-circuit is created by connecting the cathodes and the anode by a metal rod. After the power supply has been switched on the rod is drawn from the cathode towards the anode, which ignites the arc. Inherent to this procedure, however, is the formation of craters on the cathode and the removal of material from the metal rod, both of which give rise to contamination.

The cascade plates (26) which are preferably made of copper are of a relatively simple design. Because of the large power density and high gas temperature (ca 10000 K.) of the plasma (water) cooling has to be applied. Cooling water channels (not shown in FIG. 2) are preferably arranged in close proximity to the central arc channel which guarantees a good cooling efficiency. The temperature of the copper wall which contacts the plasma in most cases remains below 80 degrees Celsius. Therefore no contamination of the plasma with copper atoms will occur. The cascade plates (26) are separated and electrically isolated by a system of (e.g. O-ring) vacuum sealings (27), spacers (28) (e.g. made of polyvinylchloride) and central Boron Nitride rings (29). The vacuum sealings (27) allow the arc to be operated at a pressure ranging from 0.1 to 5 Bar. The central Boron Nitride rings (29) have a white colour and reflect the radiation which is emitted from the plasma; their function is to protect the vacuum sealings from melting by radiation absorption.

At the end of the central channel (19), opposing the three cathodes (20), the anode (5) is located. It consists of an easily exchangable, conically shaped core which is pressed slightly in the conical opening of a water cooled anode support (30) (e.g. made of copper). Cooling water is supplied via inlet means 31A and removed via outlet means 32B. The core of anode (5) can be made of Tungsten or, in the case of the presence of carbon atoms in the arc gas, oxygen-free copper. The core contains a central opening with a diameter ranging from 0.1-15 mm, and preferably from 0.5-8 mm. The nozzle, which is effectively created by the central opening in the anode, can be given a sonical or a supersonical shape. The anode assembly is kept in place by means of pressing ring (32) and electrically isolated by means of isolating mantle (33).

The cascade plates (26) of the plasma generation means are fixedly arranged together with cathode support (36) by means of bolt (34), and screw (35). Plates (26) are electrically isolated by means of isolating-mantle (37), -cover (39) and -rings (38, 40). The plasma generated inside central channel (19) can be observed through window (41) arranged in window mounting ring (42) which is connected to housing (43). Plasma-forming fluid can be introduced via inlet means (15).

The complete cascaded arc plasma generation means are preferably in communication with a relatively large vacuum system in such a way that the plasma is allowed to be extracted through the nozzle in anode (5). The pumping speed is chosen large enough to make sure that the expansion of the plasma into the sub-atmospheric plasma treating section (3) shows supersonic behaviour. In that case the thermal equilibrium of the arc plasma is "frozen". Three-particle and radiative recombination processes are too slow to allow a substantial part of the electrons and ions to disappear. Since the gas- and electron temperatures of the arc plasma have values around 10000 K. the sound velocity is about 1750 m/s. This sets limits to the mass flow, because the sonic velocity is reached at the location with the smallest diameter (in most cases the nozzle exit).

Apart from supersonic expansion of the neutral atoms it appears that another physical process occurs, which greatly improves the efficiency of the system. The electrons in the plasma have a larger mobility than the ions. Therefore they can diffuse more quickly, so they will move to the outer regions of the expanding plasma. An electrical field will be generated large enough to slow down the electrons and accelerate the ions somewhat. The field strength will increase until the drift velocities of electrons and ions are equal. Then the equilibrium situation is reached (concept of ambipolar diffusion). The centre of the beam and the area near the nozzle (5) will be charged slightly positive with respect to the downstream regions. As a result the ions will be accelerated slightly in an axial direction, and the electrons will keep them together in a highly ionized plasma beam. The ionization equilibrium that was established in the arc plasma is transported in a very efficient manner towards the surface (8) which is to be plasma treated. The neutral particles are allowed to diffuse freely, and a number of them will never reach surface (8). The transfer time from nozzle exit (5) to surface (8) is about 1 msec. This is too short for substantial recombination or reassociation to take place.

If the energy of the particles is still not high enough for a particular surface treatment, after supersonic expansion, one can increase it by applying an auxiliary discharge. The surface to be treated is electrically isolated from housing (1), and a voltage of about −100 Volt is applied to it. In that case a self supporting discharge is created at a current of about 200 mA. As the substrate surface (8) acts as the cathode of the discharge, the ions will be accelerated in the cathode fall region, where the plasma voltage decreases. In this way the intensity of the ion bombardment impinging on surface (8) can be controlled.

Even if the reactant fluid is injected further downstream in the plasma treating section (3) the plasma beam will be quenched strongly. The reactive atoms can diffuse backwards to the nozzle (5). Diffusion stops here, as the viscosity of the arc plasma is too large to allow retrodiffusion. The potential energy of the electron-ion pairs can be used to break the bonds in injected hydrocarbon reactant molecules. If not too many bonds are broken one can obtain polymer chains. The viscosity of the low pressure plasma beam is still large enough to accelerate the cracked molecules towards surface (8) which will result in an excellent reactant deposition rate with this set-up.

The invention furthermore relates to membranes comprising a membrane layer prepared according to a process as described hereinbefore.

Membrane-layers can be distinguished as to their microstructural form in porous ones and non-porous or dense membrane layers. The latter type of membrane layer has the ability to allow selective transport of molecular species which makes membranes containing such layers suitable for molecular separation processes, such as gas separation and separation of liquid hydrocarbons from solvents. With such dense membranes molecules of similar size can be separated when their solubility and/or diffusivity in the membrane layer differs significantly.

However, a problem associated with the use of dense membrane layers is their vulnerability due to their usually very small thickness of e.g. 10-1000 nm which is required to attain acceptable permeability rates for commercial applications.

It has already been proposed to strengthen the such ultrathin, dense, selective membrane layers by supporting them by means of a porous substrate which shows a very high permeability in combination with a low selectivity for gaseous and/or liquid compounds, compared with the dense top layer.

Furthermore, it is known to interpose a dense, highly permeable intermediate layer between a porous substrate and a dense, selective top layer.

Surprisingly, it has now been found that plasma-treated membranes having high selectivities can be prepared using very short deposition treating times (in the order of seconds rather than minutes) by allowing reactants to form a membrane layer on top of a (preferably porous) substrate which may have been coated first with an intermediate layer on the side which is to be plasma-treated, employing the apparatus and/or process according to the invention.

The dense, highly permeable intermediate layer serves two purposes, viz. support of the (polymer) layer formed by plasma-treating and distribution of fluid over the porous substrate. The stability of the intermediate layer enables the application of a very thin top layer formed by a selective plasma-polymerized film in combination with a substrate having pores of a size sufficiently large to keep the flow resistance imposed by said pores upon use of the membrane relatively small. The second function of the intermediate layer, i.e. distribution of the fluid passed through the dense selective polymer film, allows the whole area of the latter film to be effectively used for fluid separation, despite the presence of the porous substrate. The intermediate layer therefore allows at a given composition of the membrane film higher permeation rates than obtainable with membranes with porous substrates.

The intermediate layer should have a permeability which is larger than the permeability of the dense top layer, so that the flow of permeate through the top layer is not hampered by the presence of the intermediate layer. The permeability of the intermediate layer compared to the permeability of the top layer should be chosen such that the permeate concentration difference over the top-layer is not or only marginally influenced by the presence of the intermediate layer and porous substrate. Since the intermediate layer is in itself supported on a microporous substrate the thickness of the intermediate layer can be kept very small. For optimal permeability, the thickness of the intermediate layer is preferably smaller than about 5 μm. The minimum thickness of the intermediate layer should be so chosen so as to enable the permeate to pass through said layer into the microporous substrate at a rate at least equal to the rate of permeate flow through the selective top layer. The minimum thickness required for the permeate flow depends upon the composition of said intermediate layer and the composition of the selective top layer. In general it can be stated that the thickness of the intermediate layer should be at least 0.01 μm in order to prevent sagging of said layer into the pores of the microporous substrate.

The intermediate layer may suitably consist of a homopolymer, a copolymer or a miscible mixture of polymers. Typical examples of homopolymers suitable for forming gas separation membranes are organosiloxanes such as a polydimethylsiloxane. Copolymers of siloxanes and polycarbonates may also be applied.

The selective top layer of plasma polymerizate preferably has a thickness of less than 0.1 μm in order to keep the permeability through said layer at an acceptable level. It is assumed that since various modes of reactions take place simultaneously in plasma polymerization the polymer film thereby obtained would have a chemical composition different from that of a polymer film formed by conventional polymerization. Differences in chemical composition may be deduced from differences in gas separation factor between conventional polymer films and films of plasma polymerizate. The fact that plasma polymerizate films of a given organic compound in some cases have a gas separation selectivity superior to that of a polymer film of said compound might be explained from the complex molecular structure of plasma polymerizate films.

The porous substrate may be formed from any suitable material and may have any suitable shape. A porous polymer e.g. polyalkylene film can be suitably used for serving as a porous substrate for the selective top layer and the intermediate layer. Porous polypropylene is a preferred substrate.

It is also possible to use various porous inorganic materials as substrate for the process and membranes according to the invention. Suitably, the materials applied are of a ceramic nature, either crystalline or substantially amorphous, in particular alumina, silica, porous glass or quartz. These substrates may be flat or tubular. Tubular-, and in particular cappillary, membranes can withstand relatively high pressure differences between their inner- and outer-walls for a given wall thickness and are therefore sometimes preferred over flat membranes.

The pores in the porous substrate should be relatively small for allowing support of thin films but should on the other hand be sufficiently large as to restrict flow resistance upon the passage of permeate. The pores should preferably have a diameter in the range of 1 nanometer to 1 micrometer. The surface porosity of the porous substrate should be chosen such that the permeate throughput through said substrate at least equals the permeate throughput of the selective top layer formed by plasma polymerization.

Membranes according to the invention are suitably provided with a further dense layer on top of the selective top layer, for protecting the latter against mechanical damage. This dense protecting layer should have a high permeability but does not need to be selective. The thickness of the protective layer should preferably be chosen smaller than about 5 μm, in order to keep the permeability relatively high compared with the permeability of the selective layer. The protecting layer may consist of a homopolymer, a copolymer or a mixture of polymers. In a suitable embodiment the protecting layer has a composition identical to that of the intermediate layer.

The following Example illustrates the invention.

Three-layered membranes comprising a porous polypropylene support layer, an intermediate organosilane polymer layer and a dense, selective top layer were prepared by depositing a layer of plasma polymerized toluene or methane in the presence of argon on a substrate comprising the support- and intermediate layers in an apparatus as described hereinbefore and depicted in FIGS. 1 and 2.

The cascade plasma generation means employed in the experiments comprised 10 cascade plates, each having a thickness of 5 mm measured in the direction of the central channel, which plates were separated by 2 mm thick polyvinyl chloride isolating spacers. The nozzle diameter was 4 mm.

The dimensions of the cylindrical housing were:
length: 1.200 m
diameter: 0.500 m
volume: 0.324 m$^3$ The applied gas flow rates (expressed in cm$^3$ (S.T.P.)/s) were:
argon: 70
methane: 1.2
toluene: 1.8

The expression "S.T.P." means "Standard Temperature of 0° C. and Pressure of 1 bar".

The results of two different experiments are given in the following Table.

TABLE

| Experiment No. | Reactant | Arc current (A) | P housing (Pa) | T dep. (s) | Selectivity |
|---|---|---|---|---|---|
| 1 | toluene | 20 | 110 | 14 | 17 |
| 2 | methane | 50 | 100 | 6 | 12 |

In the above Table "arc current (A)" is the current in the central channel of the cascade arc plasma generation means, expressed in Ampères.

"P housing (Pa)" is the pressure inside the plasma treating section of the housing, expressed in Pascal ($=10^{-5}$ bar).

"T dep (s)" is the deposition time, in seconds, required for the formation of a dense, selective top layer having a thickness of 0.1–0.2 μm.

The selectivity of the resulting membranes was calculated by dividing the values obtained for the permeability of carbon dioxide and methane, expressed in $Nm^3.m^{-2}.day^{-1}.bar^{-1}$.

From the results given in the Table it will be clear that highly selective membranes can be prepared with very short plasma deposition/treating times, employing the apparatus and process according to the invention.

Many other variations and modifications may be made in the apparatus and techniques hereinbefore described by having experience in this technology, without departing from the concept of the present invention. Accordingly, it should be clearly understood that the apparatus and methods depicted in the accompanying drawings and referred to in the foregoing description are illustrative only and are not intended as limitations on the scope of the invention.

What is claimed is:

1. A method for depositing a membrane layer formed from reactants on a substrate surface, said method comprising the steps of:

providing a plasma surface treating apparatus having a plasma generation section which is capable of operating at least at substantially atmospheric pressure to generate a high temperature plasma by means of a cascaded arc, said section including an anode having a nozzle-shaped opening defined therethrough; and an enclosed plasma treating section which is capable of operation at a lower pressure than the plasma generation section, said plasma treating section including:

rim-shaped skimming means located adjacent said anode nozzle-shaped opening capable of directing a plasma beam toward said substrate surface which is to be treated with said plasma beam;

material support means to support said substrate;

fluid reactant inlet means located between said rim-shaped skimming means and said material support means, said inlet means including annular shaped distribution means for contacting fluid reactants with said plasma beam, said annular distribution means having an annular inner wall shaped to define a central opening through said inlet means, said annular wall positioned about the path of flow of said plasma beam, said annular distribution means spaced a distance greater than the thickness of said rim-shaped skimming means away from said nozzle-shaped anode; and pumping means placed in fluid communication with said plasma treating section for causing said plasma to exhibit supersonic behavior by sufficient withdrawal of gases from said plasma treating section;

generating said plasma in said plasma generation zone which is maintained at a pressure of at least 0.1 bar;

expanding said plasma through said nozzle-shaped anode into said plasma treating zone which is maintained at a pressure of less than 0.1 bar by actuation of said pumping means; thereafter sequentially passing said plasma beam through said rim-shaped skimming means and said annular shaped distribution means, said rim-shaped skimming means channeling the flow of said plasma toward said distribution means prior to passage of said plasma through said distribution means;

introducing at least one fluid reactant from said distribution means into said plasma beam;

impinging said plasma beam on said substrate surface; and allowing the fluid reactants carried by said plasma beam to form a membrane layer on said substrate surface.

* * * * *